(12) United States Patent
Tomita et al.

(10) Patent No.: US 9,401,421 B2
(45) Date of Patent: Jul. 26, 2016

(54) SWITCHING DEVICE

(71) Applicant: TOYOTA JIDOSHA KABUSHIKI KAISHA, Toyota-shi, Aichi-ken (JP)

(72) Inventors: Hidemoto Tomita, Toyota (JP); Masakazu Kanechika, Nagakute (JP); Hiroyuki Ueda, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/657,083

(22) Filed: Mar. 13, 2015

(65) Prior Publication Data

US 2015/0295073 A1    Oct. 15, 2015

(30) Foreign Application Priority Data

Apr. 10, 2014   (JP) .................................. 2014-081277

(51) Int. Cl.
| | |
|---|---|
| H01L 29/15 | (2006.01) |
| H01L 31/0256 | (2006.01) |
| H01L 29/778 | (2006.01) |
| H01L 29/43 | (2006.01) |
| H01L 29/66 | (2006.01) |
| H01L 29/20 | (2006.01) |
| H01L 29/10 | (2006.01) |

(52) U.S. Cl.
CPC .......... *H01L 29/7787* (2013.01); *H01L 29/432* (2013.01); *H01L 29/66462* (2013.01); *H01L 29/7781* (2013.01); *H01L 29/1066* (2013.01); *H01L 29/2003* (2013.01)

(58) Field of Classification Search
CPC ....... H01L 33/06; H01L 33/26; H01L 33/325; H01L 33/30; H01L 33/007; H01L 33/0075
See application file for complete search history.

(56) References Cited

U.S. PATENT DOCUMENTS

| | | | | |
|---|---|---|---|---|
| 5,693,963 A | * | 12/1997 | Fujimoto | .............. H01L 33/325 257/102 |
| 2007/0290230 A1 | * | 12/2007 | Kawaguchi | ............ B82Y 20/00 257/196 |
| 2009/0146182 A1 | | 6/2009 | Hikita et al. | |
| 2012/0033444 A1 | * | 2/2012 | Moon | ..................... H01L 33/04 362/606 |
| 2013/0082276 A1 | | 4/2013 | Park et al. | |
| 2013/0146890 A1 | | 6/2013 | Hwang et al. | |
| 2014/0175455 A1 | | 6/2014 | Tanimoto | |
| 2015/0179874 A1 | * | 6/2015 | Li | ....................... H01L 33/0025 257/94 |

FOREIGN PATENT DOCUMENTS

| | | |
|---|---|---|
| JP | 2009-141244 A | 6/2009 |
| JP | 2011-029507 A | 2/2011 |
| JP | 2013-080894 A | 5/2013 |
| JP | 2014-140024 A | 7/2014 |

\* cited by examiner

*Primary Examiner* — Thanh Y Tran
(74) *Attorney, Agent, or Firm* — Oliff PLC

(57) ABSTRACT

A switching device provided herewith includes first to fourth semiconductor layers and a gate electrode. The second semiconductor layer is of a first conductive type or an un-dope type and located on the first semiconductor layer. A hetero junction is formed between the first and the second semiconductor layers. The third semiconductor layer is of a second conductive type and located on the second semiconductor layer. The fourth semiconductor layer is of a second conductive type and located on the third semiconductor layer. A hetero junction is formed between the third and the fourth semiconductor layers. The gate electrode electrically connected to the fourth semiconductor layer.

6 Claims, 10 Drawing Sheets

SWITCHING DEVICE

CROSS-REFERENCE TO RELATED APPLICATION

This application claims priority to Japanese Patent Application No. 2014-081277 filed on Apr. 10, 2014, the contents of which are hereby incorporated by reference into the present application.

TECHNICAL FIELD

A technique disclosed in the description relates to a switching device.

DESCRIPTION OF RELATED ART

Japanese Patent Application Publication No. 2013-080894 discloses a HEMT including a first nitride layer, a second nitride layer connected to the first nitride layer by a hetero junction, a p-type nitride layer being in contact with the second nitride layer, an n-type nitride layer being in contact with the p-type nitride layer, and a gate electrode connected to the n-type nitride layer. This HEMT uses a 2DEG channel formed on an interface between the first nitride layer and the second nitride layer as a current path. When a gate voltage is low, since the interface is partially depleted by a depletion layer extending from the p-type nitride layer, no 2DEG channel is formed in a depleted region. For this reason, the HEMT is in an off state. When the gate voltage rises, the depletion layer on the interface is eliminated, and a 2DEG channel is formed in the entire area of the interface. For this reason, the HEMT is turned on. More specifically, the HEMT is of a normally OFF type. In the HEMT in Japanese Patent Application Publication No. 2013-080894, an n-type nitride layer is disposed between the gate electrode and the p-type nitride layer. When the gate voltage rises, a reverse voltage is applied to a p-n junction between the n-type nitride layer and the p-type nitride layer. Therefore, a gate leakage current (more specifically, a current flowing from the gate electrode to the first and second nitride layers) is suppressed.

BRIEF SUMMARY

In the HEMT in Japanese Patent Application Publication No. 2013-080894, since the n-type nitride layer is disposed between the gate electrode and the p-type nitride layer, a potential difference occurs between the n-type nitride layer and the p-type nitride layer when the gate voltage rises. For this reason, when the gate voltage rises, the potential of the n-type nitride layer rises to substantially the same potential as that of the gate electrode, but the potential of the p-type nitride layer does not rise to the potential of the gate electrode. As described above, the potential of the p-type nitride layer does not easily rise, the depletion layer extending from the p-type nitride layer is not eliminated and the HEMT is not turned on until the gate voltage is raised to a relatively high voltage. In this manner, the HEMT in Japanese Patent Application Publication No. 2013-080894 has a problem of a high gate threshold value. Thus, in this description, a switching device having a small gate leakage current and a small gate threshold value is provided.

A switching device disclosed herewith comprises first, second, third, and fourth semiconductor layers and a gate electrode. The second semiconductor layer is of a first conductive type or an undoped type and located on the first semiconductor layer. The second semiconductor layer forms a hetero junction with the first semiconductor layer. The third semiconductor layer is of a second conductive type and located on the second semiconductor layer. The fourth semiconductor layer is of a second conductive type and located on the third semiconductor layer. The fourth layer forms a hetero junction with the third semiconductor layer. The gate electrode is electrically connected to the fourth semiconductor layer. In the description, the "first conductive type" means either an n-type or a p-type, and the "second conductive type" means a conductivity type different from the first conductive type.

In this switching device, a carrier gas (more specifically, 2DEG or 2DHG) in an interface between the first semiconductor layer and the second semiconductor layer is used as a current path. When the gate voltage is low, the interface is depleted by the depletion layer extending from a third semiconductor layer, and the switching device is in an off state. When the gate voltage rises, the depletion layer in the interface is eliminated, and the switching device is turned on. In this switching device, the fourth semiconductor layer which is of the same second conductive type as that of the third semiconductor layer and is connected to the third semiconductor layer by the hetero junction is formed between the gate electrode and the third semiconductor layer. A barrier is formed in the hetero junction in an interface between the third semiconductor layer and the fourth semiconductor layer. For this reason, when the gate voltage is applied, the barrier in the hetero junction suppresses current from flowing from the fourth semiconductor layer to the third semiconductor layer. More specifically, the gate leakage current is suppressed. On the other hand, since the third semiconductor layer and the fourth semiconductor layer are of the same second conductive type, a potential difference is rarely generated across the third semiconductor layer and the fourth semiconductor layer when the gate voltage rises. For this reason, the switching device has a small gate threshold value.

DETAILED DESCRIPTION

First, features of embodiments will be described below. (Feature 1) a second conductive type impurity concentration in the third semiconductor layer is higher than a second conductive type impurity concentration in the fourth semiconductor layer.

(Feature 2) the first, second, third, and fourth semiconductor layers are nitride semiconductor layers.

(Feature 3) The first semiconductor layer is a GaN layer. The second semiconductor layer is an AlGaN layer being of an n-type or the undoped type. The third semiconductor layer is a GaN layer being of a p-type. The fourth semiconductor layer is an $Al_xGa_{1-x}N$ layer (0<x<0.2).

(Feature 4) The first semiconductor layer is a GaN layer. The second semiconductor layer is an AlGaN layer being of an n-type or the undoped type. The third semiconductor layer is a GaN layer being of p-type. The fourth semiconductor layer is an $In_yAl_xGa_{1-x-y}N$ layer and has a bandgap wider than that in the third semiconductor layer.

(Feature 5) A gate electrode is connected to a fourth semiconductor layer directly or through a semiconductor layer of a second conductivity type.

Figure 1:
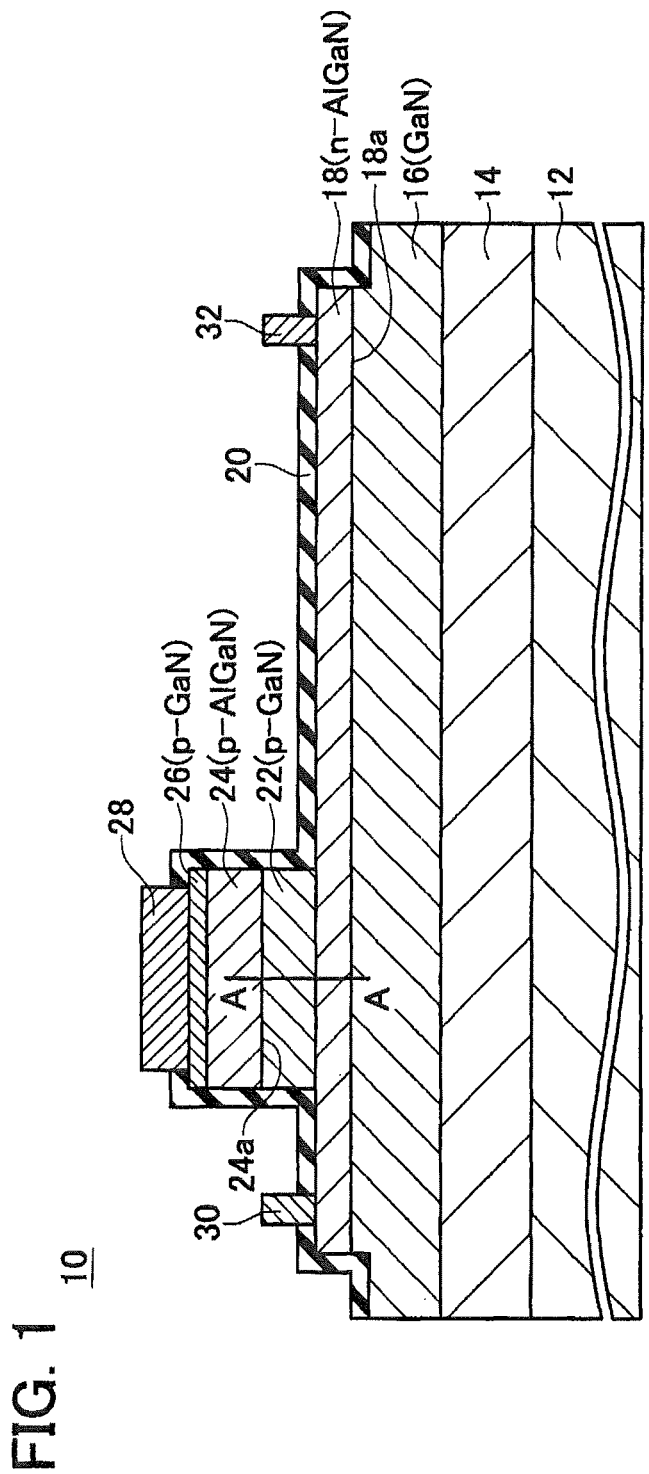
FIG. 1 is a longitudinal sectional view of a HEMT 10 according to a first embodiment.

A HEMT 10 according to an embodiment shown in FIG. 1 includes a substrate 12, a buffer layer 14, an electron transit layer 16, an electron supply layer 18, an insulating film 20, a p-type GaN layer 22, a p-type AlGaN layer 24, a p-type GaN layer 26, a gate electrode 28, a source electrode 30, and a drain electrode 32.

The substrate 12 is made of silicon. However, the substrate 12 may be made of another material (for example sapphire, SiC, GaN, or the like) that can crystal-grow a compound semiconductor layer on a surface thereof.

The buffer layer 14 is made of GaN (or AlGaN or the like). However, the buffer layer 14 may be made of another material such as MN. The buffer layer 14 is formed on the substrate 12.

The electron transit layer 16 is made of i-type (i.e., undoped type) GaN. The electron transit layer 16 is formed on the buffer layer 14.

The electron supply layer 18 is made of n-type $Al_yGa_{1-y}N$ (0.18<y<0.20). An n-type impurity concentration in the electron supply layer 18 is very low. The electron supply layer 18 is formed on the electron transit layer 16. An interface 18a between the electron supply layer 18 and the electron transit layer 16 serves is a hetero-junction interface. In the hetero-junction interface 18, 2DEG (two-dimensional electron gas) is formed.

The p-type GaN layer 22 is made of p-type GaN. The p-type GaN layer 22 contains Mg as a p-type impurity. The p-type GaN layer 22 is formed on the electron supply layer 18. The p-type GaN layer 22 is in contact with a part of the surface of the electron supply layer 18.

The p-type AlGaN layer 24 is made of p-type $Al_xGa_{1-x}N$ (0<x<0.2). The p-type GaN layer 24 contains Mg as a p-type impurity. A concentration of a p-type impurity (i.e., Mg) of the p-type AlGaN layer 24 is lower than the concentration of the p-type impurity (i.e., Mg) of the p-type GaN layer 22. The p-type AlGaN layer 24 is formed on the p-type GaN layer 22. An interface 24a between the p-type AlGaN layer 24 and the p-type GaN layer 22 is a hetero junction interface.

The p-type GaN layer 26 is made of p-type GaN. The p-type GaN layer 26 contains Mg as a p-type impurity. A concentration of a p-type impurity (i.e., Mg) of the p-type GaN layer 26 is higher than the concentration of the p-type impurity (i.e., Mg) of the p-type GaN layer 22. The p-type GaN layer 26 is formed on the p-type AlGaN layer 24.

The gate electrode 28 is formed on the p-type GaN layer 26. Since the concentration of the p-type impurity of the p-type GaN layer 26 is high, the gate electrode 28 is in contact with the p-type GaN layer 26 by ohmic contact.

The source electrode 30 and the drain electrode 32 are formed on the electron supply layer 18. When the surface of the electron supply layer 18 is planarly viewed, between the source electrode 30 and the drain electrode 32, the p-type GaN layer 22, the p-type AlGaN layer 24, the p-type GaN layer 26, and the gate electrode 28 are disposed.

The insulating film 20 covers the surface of the electron supply layer 18 and the side surfaces of the p-type GaN layer 22, the p-type AlGaN layer 24, and the p-type GaN layer 26.

An operation of the HEMT 10 will be described below. In the operation of the HEMT 10, a voltage that makes the sign of the drain electrode 32 positive is applied between the drain electrode 32 and the source electrode 30. As described above, in the hetero-junction interface 18a, 2DEG (2-dimensional electron gas) is formed. However, when the gate voltage applied to the gate electrode 28 is smaller than a threshold value, a depletion layer spreads from the p-type GaN layer 22 into the electron supply layer 18 and the electron transit layer 16. In this case, the depletion layer reaches the hetero-junction interface 18a formed immediately below the p-type GaN layer 22, and the 2DEG is formed immediately below the p-type GaN layer 22. Thus, when the gate voltage is smaller than the threshold value, a current does not flow between the drain electrode 32 and the source electrode 30. When the gate voltage is raised to the threshold value or more, the potential of the p-type GaN layer 22 rises. At this time, the depletion layer retreats on the p-type GaN layer 22 side, the depletion layer in the electron supply layer 18 and the electron transit layer 16 are substantially eliminated. At this time, 2DEG is also generated in the hetero-junction interface 18a formed immediately below the p-type GaN layer 22. More specifically, 2DEG is generated in a substantially entire area of the hetero-junction interface 18a. Thus, electrons transit from the source electrode 30 toward the drain electrode 32 in the 2DEG. More specifically, the HEMT 10 is turned on.

Figure 2:
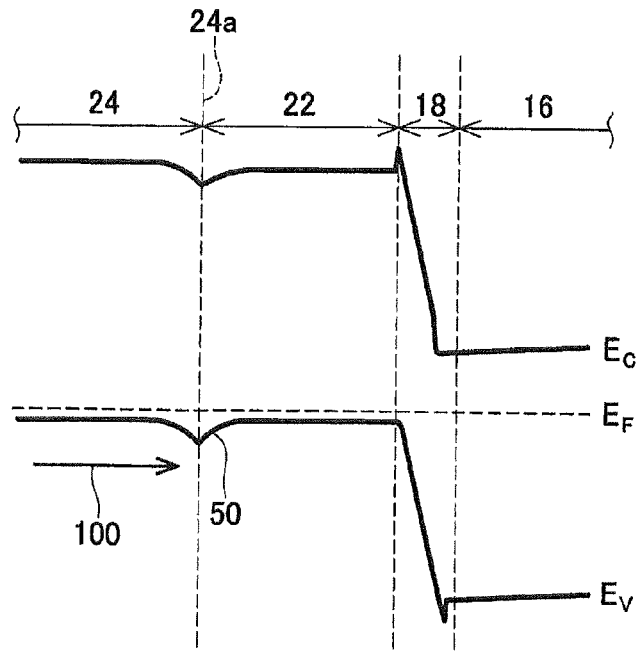
FIG. 2 is a band gap diagram along an A-A line in FIG. 1.

In application of a gate voltage, a minute current (gate leakage current) flows from the gate electrode 28 toward the electron supply layer 18. In the HEMT 10, the gate leakage current is suppressed. FIG. 2 shows a band gap in each semiconductor layer along an A-A line in FIG. 1. In FIG. 2, a reference symbol $E_F$ denotes a Fermi level; $E_c$ denotes a level at a lower end of a conduction band; and $E_v$ denotes a level at an upper end of a valence band. FIG. 2 shows a state in which a gate voltage is 0 V (i.e., a state in which the HEMT 10 is in an off state). As described above, in the HEMT 10, the hetero-junction interface 24a is formed between the p-type AlGaN layer 24 and the p-type GaN layer 22. As shown in FIG. 2, in the hetero junction interface 24a, the level $E_v$ at the upper end of the valence band locally projects downward. A convex portion 50 of the level $E_v$ serves as a barrier to suppress a leakage current. More specifically, when a gate voltage is applied, as indicated by an arrow 100 in FIG. 2, holes tend to flow from the p-type AlGaN layer 24 toward the p-type GaN layer 22. Since the convex portion 50 serves as a barrier for holes that tend to flow as indicated by the arrow 100, the holes are suppressed from flowing from the p-type AlGaN layer 24 to the p-type GaN layer 22. In this manner, the gate leakage current is suppressed.

As shown in FIG. 1, in the HEMT 10, only the p-type semiconductor layers (i.e., the p-type AlGaN layer 24 and the p-type GaN layer 26) are present between the gate electrode 28 and the p-type GaN layer 22. In other words, the gate electrode 28 is electrically connected to the p-type GaN layer 22 through only the p-type semiconductor layers. Since all of the p-type GaN layer 22, the p-type AlGaN layer 24, and the p-type GaN layer 26 are p-type semiconductor layers, potential differences among these semiconductor layers are rarely generated. Thus, the gate electrode 28 and the p-type GaN layer 22 are substantially set at the same potential. For this reason, when the gate voltage is raised, accordingly, the potential of the p-type GaN layer 22 also rises, and the HEMT 10 is easily turned on. For this reason, the HEMT 10 has a small gate threshold value (i.e., a gate voltage required to turn on the HEMT 10).

Figure 3:
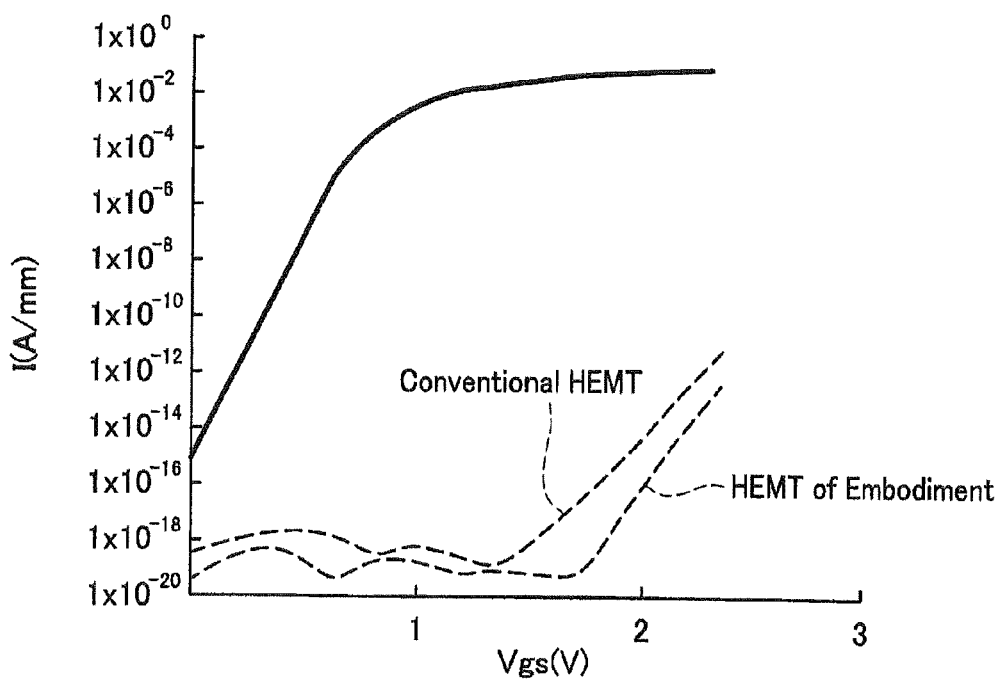
FIG. 3 is a graph for comparing the HEMT 10 according to the first embodiment with a conventional HEMT.

FIG. 3 is a graph for comparing characteristics of the HEMT 10 according to the embodiment with characteristics of a conventional HEMT (HEMT in which the gate electrode 28 is directly connected to the p-type GaN layer 22). A solid line in FIG. 3 indicates Vgs-Ids characteristics (relationship between a gate-source voltage Vgs and a drain-source current Ids when a drain-source voltage Vds is set at 1 V). In the HEMT 10 according to the embodiment and the conventional HEMT, the Vgs-Ids characteristics are substantially the same as each other. Thus, in FIG. 3, only one solid-line graph is shown. In this manner, the HEMT 10 according to the embodiment has the same small gate threshold value as that of the conventional HEMT.

A dotted line in FIG. 3 indicates Vgs-Igs characteristics (relationship between the gate-source voltage Vgs and a gate-source current Igs when the drain-source voltage Vds is set at 1 V). A current Igs corresponds to a gate leakage current. As is apparent from FIG. 3, the gate leakage current begins to flow when the voltage Vgs exceeds 1.3 V in the conventional HEMT, and the gate leakage current begins to flow when the voltage Vgs exceeds 1.7 V in the HEMT 10 according to the embodiment. For this reason, when the leakage currents are compared with each other at the same voltage Vgs (for example, Vgs=2 V), the leakage current in the HEMT 10 according to the embodiment is about 1/10 the leakage current in the conventional HEMT.

As described above, in the HEMT 10 according to the embodiment, the gate leakage current can be suppressed, and the same small gate threshold value as that in the conventional HEMT can be achieved.

Figure 4:
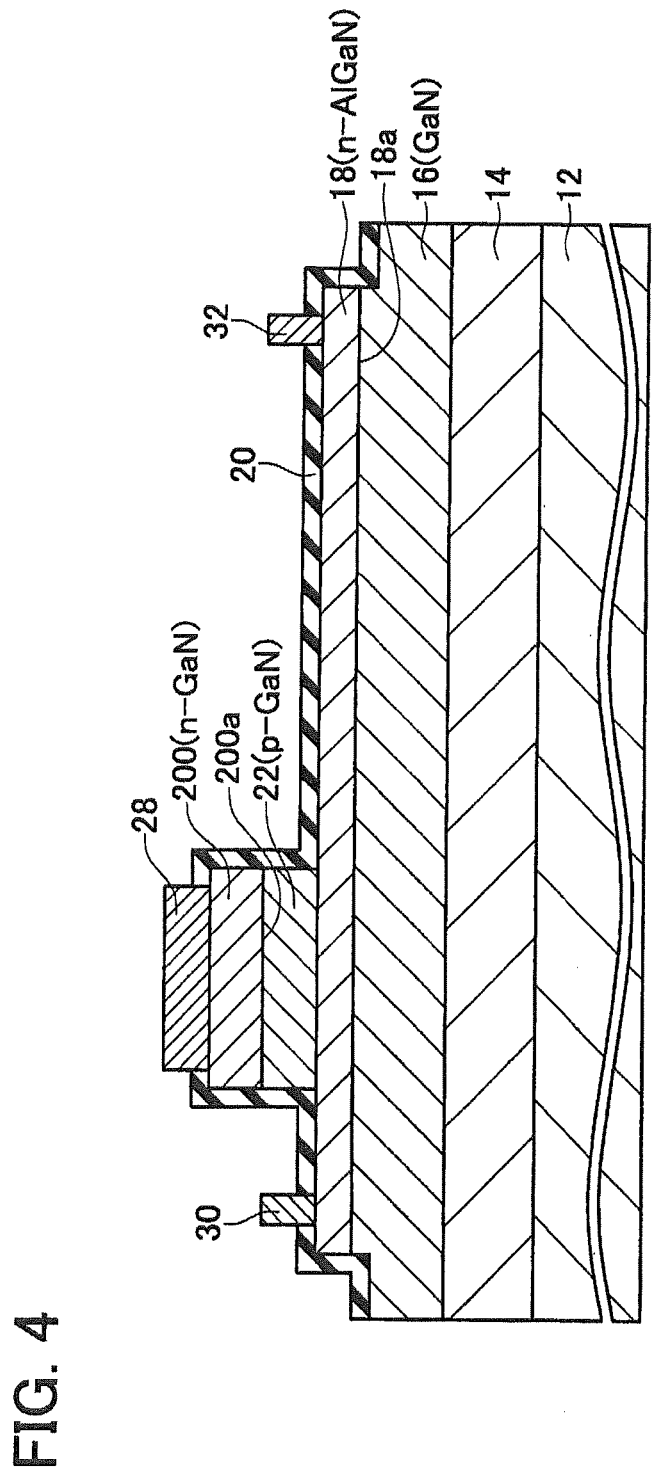
FIG. 4 is a longitudinal sectional view of a HEMT according to a comparative example.

For reference, a HEMT that suppresses a gate leakage current is suppressed by a p-n junction as in Japanese Unexamined Patent Publication No. 2013-080894 will be described below. FIG. 4 shows a HEMT according to a comparative example. For description, in FIG. 4, the same reference numbers as those in FIG. 1 denote parts corresponding to the parts in FIG. 1, respectively. In the HEMT according to the comparative example, an n-type GaN layer 200 is disposed between the gate electrode 28 and the p-type GaN layer 22. When the gate voltage is applied to the gate electrode 28, a reverse voltage is applied to a p-n junction surface 200a of the interface between the n-type GaN layer 200 and the p-type GaN layer 22. The barrier of the p-n junction surface 200a suppresses the gate leakage current. However, when the reverse voltage is applied to the p-n junction surface 200a, a potential difference is generated between the n-type GaN layer 200 and the p-type GaN layer 22. For this reason, in the HEMT according to the comparative example, when a gate voltage is raised, the potential of the n-type GaN layer 200 rises depending on the gate voltage, but the potential of the p-type GaN layer 22 does not easily rise. As a result, unless the gate voltage is raised to a high voltage, the potential of the p-type GaN layer 22 does not sufficiently rise, and depletion layers are not eliminated from the electron supply layer 18 and the electron transit layer 16. More specifically, unless the gate voltage is not raised to a high voltage, the HEMT is not turned on. In this manner, in the HEMT of the type shown in FIG. 4, although the gate leakage current can be suppressed, the gate threshold value is disadvantageously larger than that in the conventional HEMT. In contrast to this, in the HEMT 10 according to the embodiment, the gate leakage current can be suppressed, and the almost same small gate threshold value as that in the conventional HEMT can be achieved.

As described above, in the HEMT 10 according to the embodiment, the p-type impurity concentration of the p-type GaN layer 22 is higher than the p-type impurity concentration of the p-type AlGaN layer 24. For this reason, a high barrier at the convex portion 50 in FIG. 2 is achieved. More specifically, if the p-type impurity concentration is lower in the p-type GaN layer 22 than in the p-type AlGaN layer 24, the level $E_v$ at the upper end of the valence band of the p-type AlGaN layer 24 increases, and the barrier at the convex portion 50 becomes small. In contrast to this, as in the embodiment, the p-type impurity concentration of the p-type GaN layer 22 is made higher than the p-type impurity concentration of the p-type AlGaN layer 24 to make it possible to make the barrier at the convex portion 50 larger. The p-type impurity concentration of the p-type GaN layer 22 and the p-type impurity concentration of the p-type AlGaN layer 24 are preferably $3 \times 10^{19}/cm^3$ or less.

As described above, in the HEMT 10 according to the embodiment, a relation given by $0<x<0.2$ is satisfied. If the value x is excessively increased (more specifically, the ratio of Al in the AlGaN layer 24 is excessively increased), 2DEG is formed in the hetero junction interface 24a. If the 2DEG is formed in the hetero-junction interface 24a, the 2DEG adversely affects the operation of the HEMT 10. The relation given by $0<x<0.2$ is satisfied as in the HEMT according to the embodiment to make it possible to prevent the 2DEG from being formed in the hetero junction interface 24a. A relation given by $0.05<x<0.1$ is more preferably satisfied.

Figure 5:
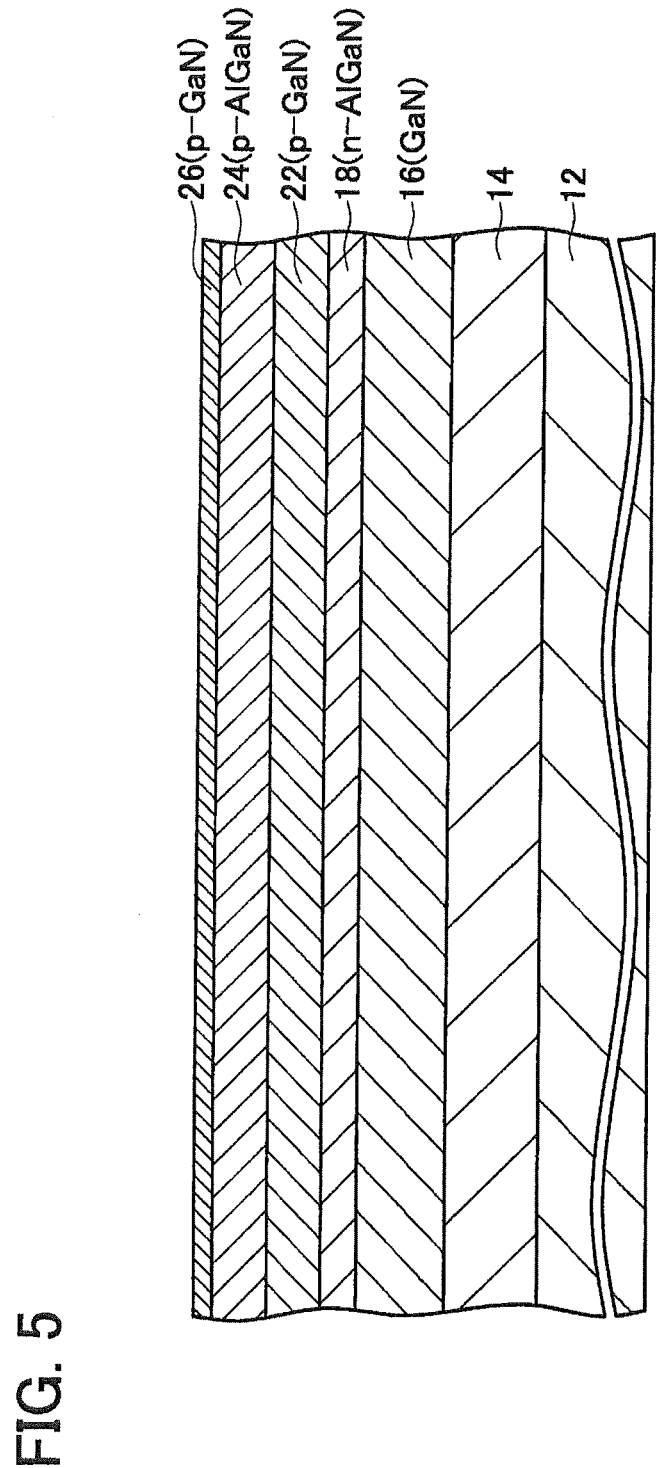
FIG. 5 is a diagram for explaining a step in manufacturing the HEMT 10 according to the first embodiment.

A method of manufacturing the HEMT 10 according to the embodiment will be described below. As shown in FIG. 5, on a (111) plane of the substrate 12 made of silicon, the buffer layer 14 having a thickness of about 2.4 µm, the electron transit layer 16 having a thickness of about 1.6 µm, the electron supply layer 18 having a thickness of about 20 nm, the p-type GaN layer 22 having a thickness of about 100 nm, the p-type AlGaN layer 24 having a thickness of about 100 nm, and the p-type GaN layer 26 having a thickness of about 5 nm are sequentially formed. These semiconductor layers are grown by an MOCVD method using trimethyl gallium (TMGa), trimethyl aluminum (TMA), and ammonia (NH3) as materials.

Figure 6:
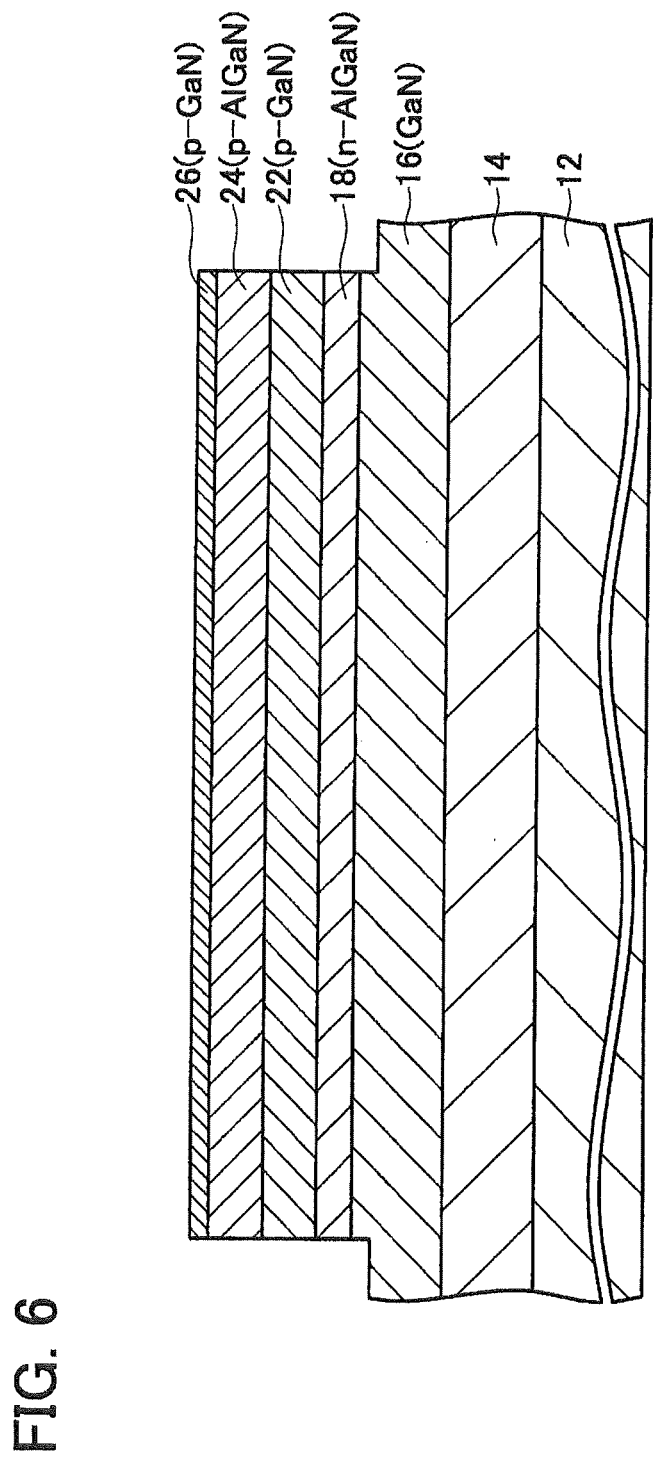
FIG. 6 is a diagram for explaining a step in manufacturing the HEMT 10 according to the first embodiment.

As shown in FIG. 6, by using ICP dry etching, the electron transit layer 16, the electron supply layer 18, the p-type GaN layer 22, the p-type AlGaN layer 24, and the p-type GaN layer 26 are partially etched. In this manner, the electron supply layer 18, the p-type GaN layer 22, the p-type AlGaN layer 24, and the p-type GaN layer 26 are separated from an adjacent device.

Figure 7:
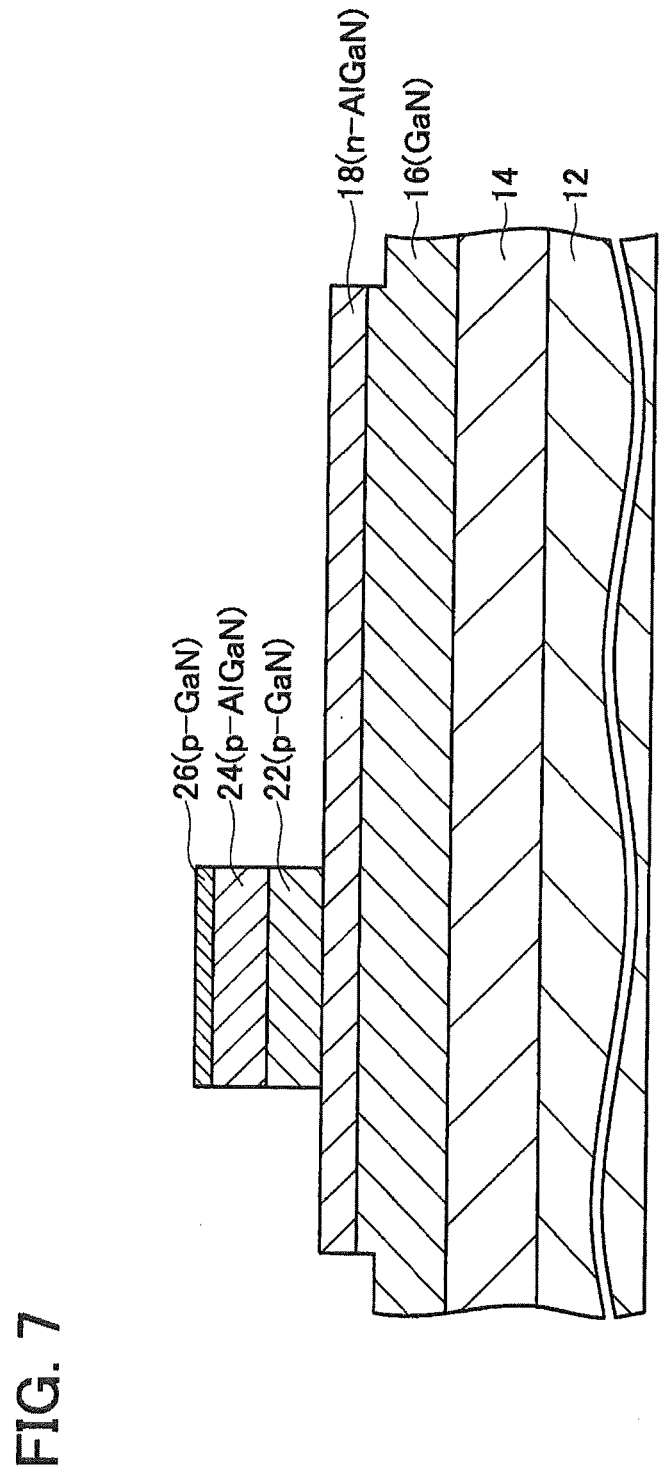
FIG. 7 is a diagram for explaining a step in manufacturing the HEMT 10 according to the first embodiment.

As shown in FIG. 7, by using ICP dry etching, the p-type GaN layer 22, the p-type AlGaN layer 24, and the p-type GaN layer 26 are partially etched. In this manner, the p-type GaN layer 22, the p-type AlGaN layer 24, and the p-type GaN layer 26 are left on only a portion where the gate electrode 28 is to be formed, and are removed from the remaining portion.

Figure 8:
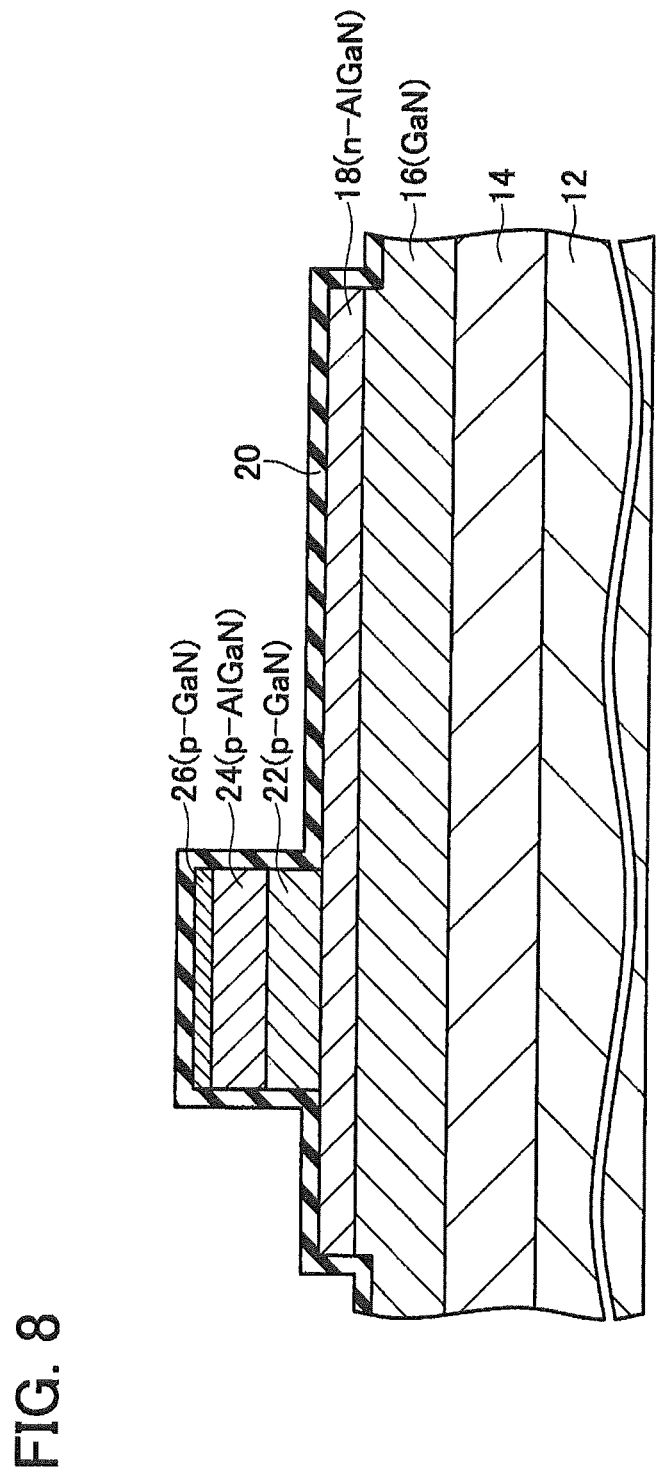
FIG. 8 is a diagram for explaining a step in manufacturing the HEMT 10 according to the first embodiment.

As shown in FIG. 8, by a plasma CVD method, the insulating film 20 having a thickness of about 100 nm is formed.

Figure 9:
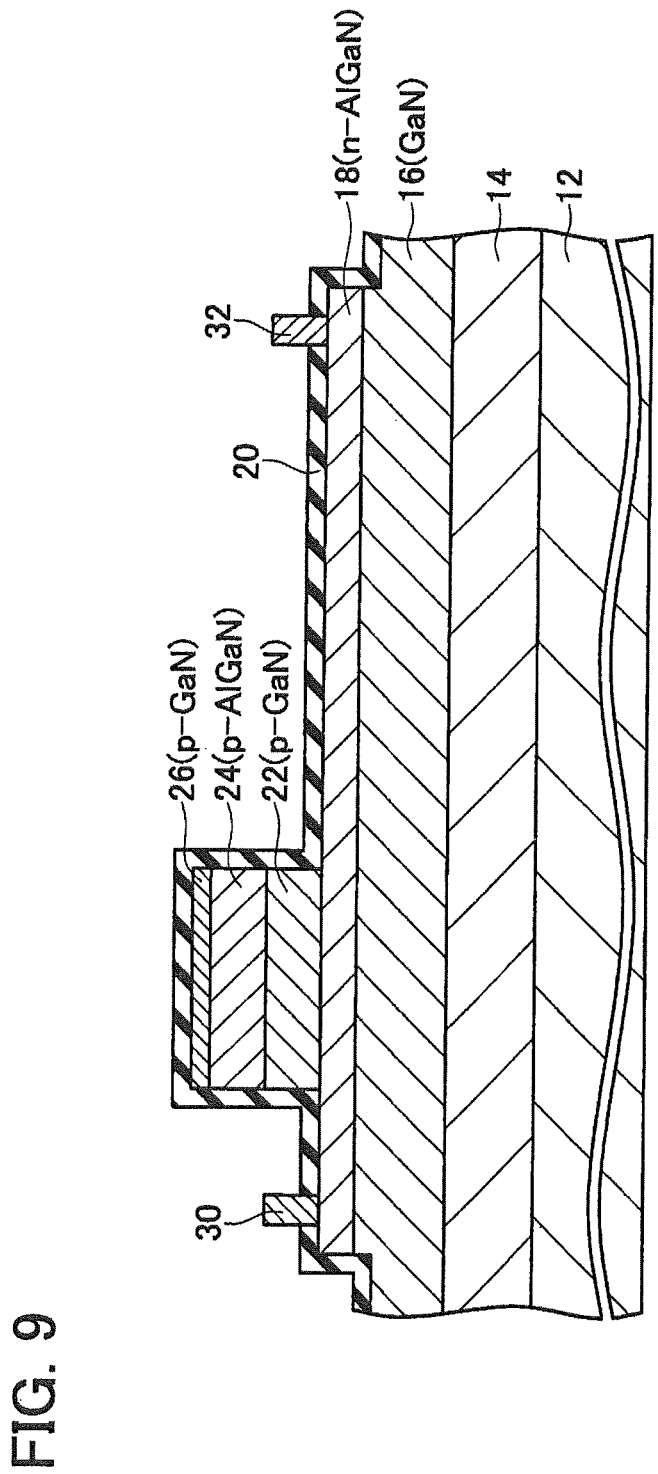
FIG. 9 is a diagram for explaining a step in manufacturing the HEMT 10 according to the first embodiment.

By patterning using photolithography and dry etching by RIE, the insulating film 20 is removed from a region in which the source electrode 30 and the drain electrode 32 should be formed in order to form an opening. As shown in FIG. 9, by using deposition and lift off, the source electrode 30 and the drain electrode 32 are formed in the opening. The source electrode 30 and the drain electrode 32 are formed by sequentially laminating a Ti layer having a thickness of about 20 nm, an Al layer having a thickness of about 200 nm, and an Ni layer having a thickness of about 40 nm by deposition.

Figure 10:
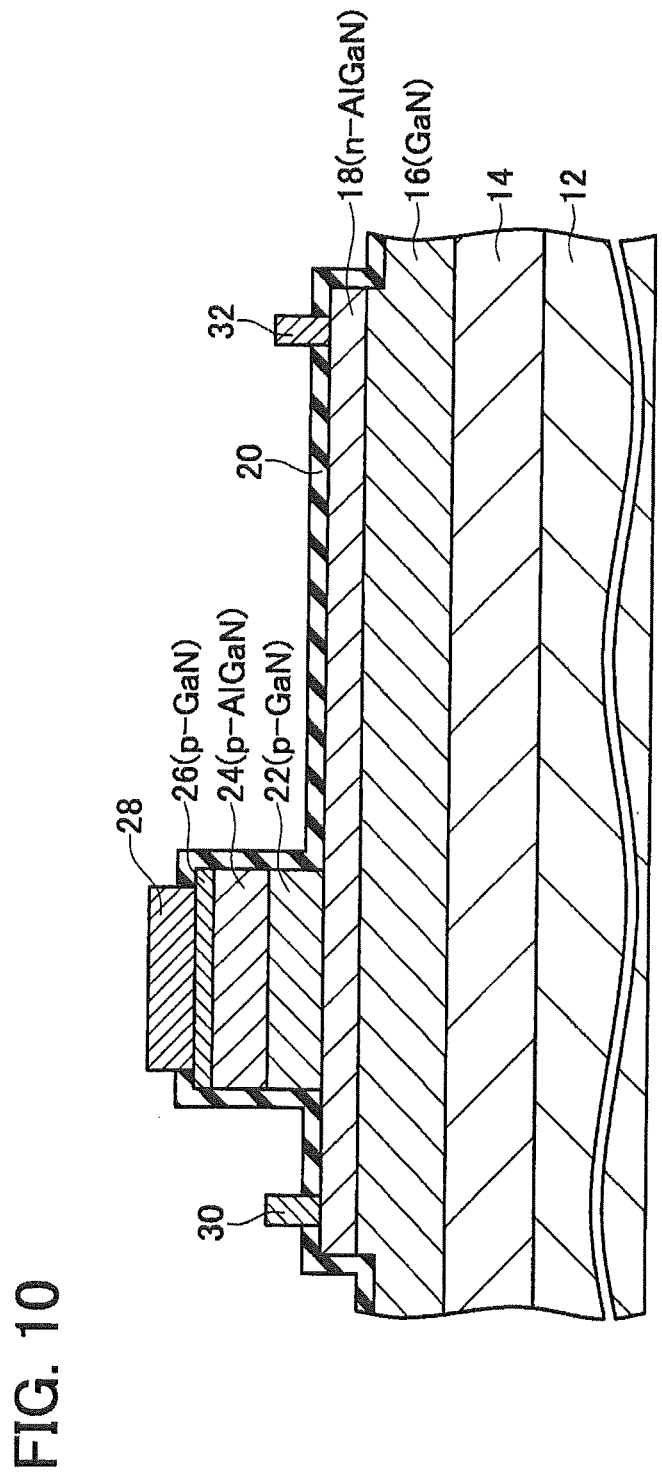
FIG. 10 is a diagram for explaining a step in manufacturing the HEMT 10 according to the first embodiment.

By patterning using photolithography and wet etching using BHF, the insulating film 20 is removed from a region in which the gate electrode 28 should be formed in order to form an opening. As shown in FIG. 10, by using deposition and lift off, the gate electrode 28 is formed in the opening. The gate electrode 28 is formed by sequentially laminating an Ni layer having a thickness of about 50 nm and an Au layer having a thickness of about 50 nm by deposition. As described above, the HEMT 10 according to the embodiment is completed.

Figure 11:
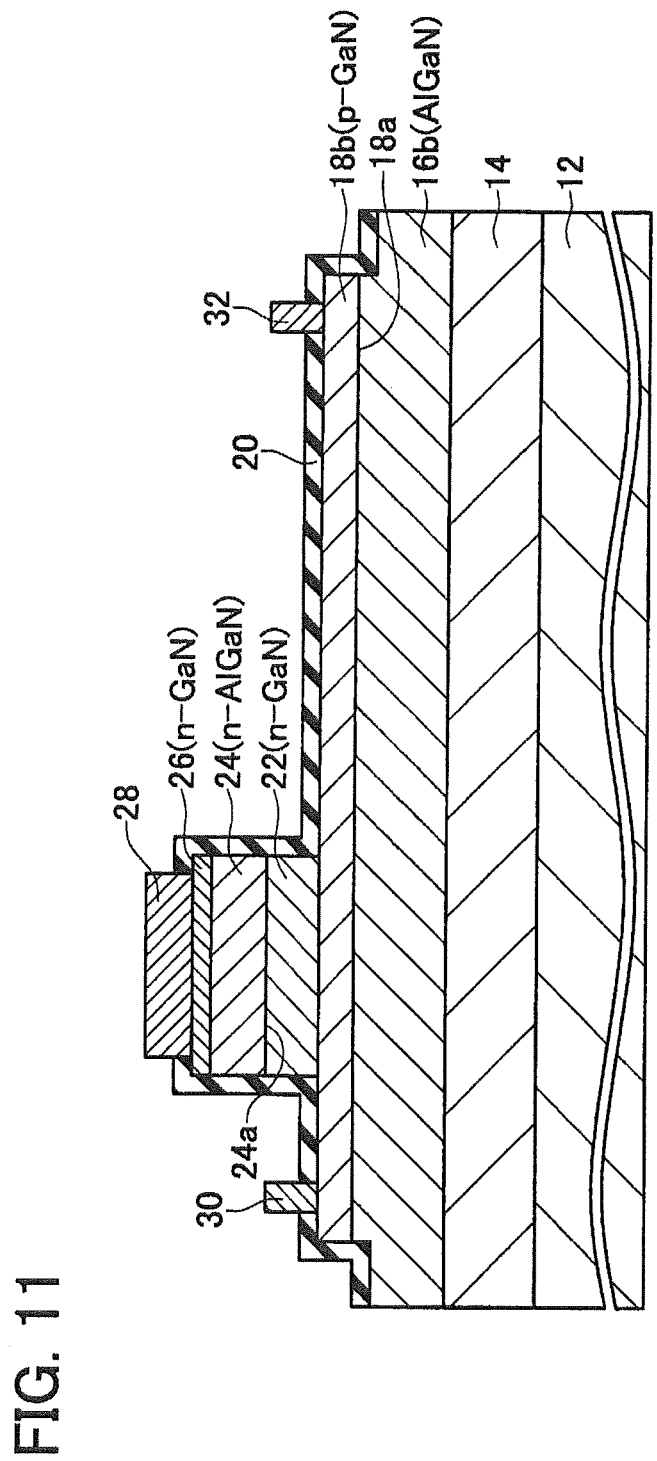
FIG. 11 is a longitudinal sectional view of a HEMT according to a second embodiment.

Although the 2DEG serves as a current path in the HEMT 10 according to the first embodiment, 2DHG (two-dimensional hole gas) may be used as a current path. FIG. 11 shows a HEMT according to a second embodiment using 2DHG as a current path. In FIG. 11, the same reference numbers as those in FIG. 1 denote parts corresponding to the parts in FIG. 1, respectively. In the configuration in FIG. 11, a hole supply layer 16b is an AlGaN layer, and a hole transit layer 18b is a p-type GaN layer. Between the gate electrode 28 and the hole transit layer 18b, a laminate structure including an n-type GaN layer 22, an n-type AlGaN layer 24, and an n-type GaN layer 26 is formed. In the HEMT, 2DHG is formed in the hetero-junction interface 18a between the hole supply layer 16b and the hole transit layer 18b. Depletion layers extending from the n-type GaN layer 22 to the hole supply layer 16b and the hole transit layer 18b perform switching for the HEMT. In this HEMT, the hetero-junction interface 24a between the n-type GaN layer 22 and the n-type AlGaN layer 24 suppresses a gate leakage current.

In the first embodiment described above, the gate electrode 28 is connected to the p-type AlGaN layer 24 through the p-type GaN layer 26. However, the gate electrode 28 may be directly connected to the p-type AlGaN layer 24. The gate electrode 28 may be connected to the p-type AlGaN layer 24 through a p-type layer different from the p-type GaN layer 26.

In the first embodiment described above, the p-type impurity concentration of the p-type AlGaN layer 24 is lower than the p-type impurity concentration of the p-type GaN layer 22. However, the p-type impurity concentration of the p-type AlGaN layer 24 may be almost equal to the p-type impurity concentration of the p-type GaN layer 22.

In the embodiments described above, the p-type AlGaN layer 24 (fourth semiconductor layer) is an $Al_xGa_{1-x}N$ layer (0<x<0.2). However, the fourth semiconductor layer may be an $In_yAl_xGa_{1-x-y}N$ layer having a band gap larger than that of the third semiconductor layer (p-type GaN layer 22). In this case, as the values x and y, arbitrary values may be employed. However, the composition, the thickness, and the impurity concentration of the semiconductor layer 24 are preferably selected such that 2DEG is not generated between the fourth semiconductor layer 24 and the third semiconductor layer 22.

In the embodiments described above, the electron supply layer 18 (second semiconductor layer) is of an n-type. However, the second semiconductor layer may be a layer in which an impurity is not intentionally doped (i.e., undoped layer). When the second semiconductor layer is an undoped layer, the second semiconductor layer may be, for example, an n-type high-resistant semiconductor layer.

The embodiments have been described in detail in the above. However, these are only examples and do not limit the claims. The technology described in the claims includes various modifications and changes of the concrete examples represented above.

The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A switching device comprising:
   a first semiconductor layer;
   a second semiconductor layer being of a first conductive type or an undoped type and located on the first semiconductor layer, the second semiconductor layer forming a hetero junction with the first semiconductor layer;
   a third semiconductor layer being of a second conductive type and located on the second semiconductor layer;
   a fourth semiconductor layer being of a second conductive type and located on the third semiconductor layer, the fourth semiconductor layer forming a hetero junction with the third semiconductor layer;
   a first electrode located on the second semiconductor layer;
   a second electrode located on the second semiconductor layer and away from the first electrode; and
   a gate electrode electrically connected to the fourth semiconductor layer and configured to switch between conduction and non-conduction between the first electrode and the second electrode.

2. A switching device of claim 1, wherein
   a second conductive type impurity concentration in the third semiconductor layer is higher than a second conductive type impurity concentration in the fourth semiconductor layer.

3. A switching device of claim 1, wherein
   the first, second, third, and fourth semiconductor layers are nitride semiconductor layers.

4. A switching device of claim 3, wherein
   the first semiconductor layer is a GaN layer,
   the second semiconductor layer is an AlGaN layer being of an n-type or the undoped type,
   the third semiconductor layer is a GaN layer being of a p-type,
   the fourth semiconductor layer is an $Al_xGa_{1-x}N$ layer, and 0<x<0.2.

5. A switching device of claim 3, wherein
   the first semiconductor layer is a GaN layer,
   the second semiconductor layer is an AlGaN layer being of an n-type or the undoped type,
   the third semiconductor layer is a GaN layer being of p-type, and
   the fourth semiconductor layer is an $In_yAl_xGa_{1-x-y}N$ layer and has a bandgap wider than that in the third semiconductor layer.

6. A switching device comprising:
   a first semiconductor layer;
   a second semiconductor layer being of a first conductive type or an undoped type and located on the first semiconductor layer, the second semiconductor layer forming a hetero junction with the first semiconductor layer;
   a third semiconductor layer being of a second conductive type and located on the second semiconductor layer;
   a fourth semiconductor layer being of a second conductive type and located on the third semiconductor layer, the fourth semiconductor layer forming a hetero junction with the third semiconductor layer; and
   a gate electrode electrically connected to the fourth semiconductor layer, wherein
   the first, second, third, and fourth semiconductor layers are nitride semiconductor layers,
   the first semiconductor layer is a GaN layer,
   the second semiconductor layer is an AlGaN layer being of an n-type or the undoped type, the third semiconductor layer is a GaN layer being of p-type, and the fourth semiconductor layer is an $In_yAl_xGa_{1-x-y}N$ layer and has a bandgap wider than that in the third semiconductor layer.

* * * * *